(12) United States Patent
Takabayashi (10) Patent No.: US 6,359,338 B1
(45) Date of Patent: Mar. 19, 2002

(54) SEMICONDUCTOR APPARATUS WITH SELF-SECURITY FUNCTION

(75) Inventor: Yasutaka Takabayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/477,721

(22) Filed: Jan. 5, 2000

(30) Foreign Application Priority Data

Jul. 9, 1999 (JP) ............................................ 11-196575

(51) Int. Cl.[7] ......................... H01L 23/48; H01L 29/40; H01L 23/52

(52) U.S. Cl. ........................ 257/750; 257/922; 257/500; 257/501; 257/508

(58) Field of Search ................................ 257/922, 750, 257/605, 635, 638, 679, 48, 499, 500, 501, 508, 774; 438/652, 118, 622

(56) References Cited

U.S. PATENT DOCUMENTS

| | | | | |
|---|---|---|---|---|
| 5,502,333 A | * | 3/1996 | Bertin et al. | 257/685 |
| 5,880,523 A | * | 3/1999 | Candelore | 257/922 |
| 6,087,728 A | * | 7/2000 | Vu et al. | 257/758 |

FOREIGN PATENT DOCUMENTS

| | | |
|---|---|---|
| EP | 0 169 941 A1 | 2/1986 |
| EP | 0 414 316 A2 | 2/1991 |
| JP | 61-67238 * | 4/1986 |
| JP | 10-2705562 | 9/1998 |
| JP | 11-154674 | 8/1999 |

* cited by examiner

Primary Examiner—Jhihan B Clark
(74) Attorney, Agent, or Firm—Volentine Francos, PLLC (57) ABSTRACT

A semiconductor apparatus includes a functional block that performs necessary functions for the proper operation; a functional signal line that is connected to the functional block to transmit a functional signal; and an enable signal line to supply an enable signal to the functional block. The enable signal line includes a part that is formed on an upper layer of the functional signal line.

20 Claims, 6 Drawing Sheets

United States Patent

SEMICONDUCTOR APPARATUS WITH SELF-SECURITY FUNCTION

TECHNICAL FIELD OF THE INVENTION

The present invention generally relates to a semiconductor apparatus, and in particular, the present invention relates to a semiconductor apparatus with self-security function, which protects restricted data stored therein.

BACKGROUND OF THE INVENTION

An IC (Integrated Circuit) may include a memory, which stored restricted data, and circuitry designed by using confidential technique or know-how. It is required to prevent such important information and technique from being analyzed or stolen by rogues. Conventionally, an IC is covered with a protection film (passivation film), so that the variation of capacity occurs when such a film is taken out in an unauthorized manner. When the variation of capacity occurs, the IC is invalidated and rogues can not analyze the restricted data stored therein.

According to the conventional technique, however, the protection film is usually transparent; therefore, it is easy to recognize the circuitry in the IC using a microscope or the like. If functional blocks arranged in the IC are discriminated, the protection film would be removed using an ion-beam device or the like without making capacity variation in the IC. As a result, the function of the circuitry can be analyzed by probing technique.

OBJECTS OF THE INVENTION

Accordingly, an object of the present invention is to provide a semiconductor apparatus in which the function of the circuitry is prevented from being stolen or analyzed.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a generic aspect of the present invention, a semiconductor apparatus includes a functional block that performs necessary functions for the proper operation; a functional signal line that is connected to the functional block to transmit a functional signal; and an enable signal line to supply an enable signal to the functional block. The enable signal line includes a part that is formed on an upper layer of the functional signal line.

The enable signal line is formed on a layer that is upper than a layer, on which the functional signal line is formed, so that the functional signal line would easily be broken at the same time when rogues remove the enable signal line and the functional block is invalidated. As a result, the functional block is prevented from being analyzed by rogues in an unauthorized manner.

Preferably, such a semiconductor apparatus further includes an opaque layer (not transparent), which is formed over the functional signal line, to cover up the functional signal line. The functional signal line is covered with the opaque layer, so that it is difficult to recognize the location of the functional signal line; and therefore, input and output signals of the functional block are prevented from being analyzed in an unauthorized manner.

A semiconductor apparatus may further include a protection layer, which is formed over the opaque layer, to protect the apparatus. Such a protection film improves the security of the semiconductor apparatus.

The opaque layer may be formed over the enable signal line to cover the enable signal line, so that the security of the semiconductor apparatus is improved. That is, when the opaque layer is removed, the enable signal line is easily broken at the same time. When the enable signal line is broken, the functional block is no longer enabled or activated, and therefore, the functional block is prevented from being analyzed by rogues in an unauthorized manner.

The opaque layer may be formed over the functional block to cover up the functional block, so that it becomes more difficult to analyze the function or operation of the functional block.

The enable signal line may be formed on the same layer as the opaque layer, or may be arranged near the opaque layer, so that the enable signal line would be easily broken at the same time when the opaque layer is removed.

The enable signal line may be connected through a resistance to one of the ground or power supply, so that the functional block is reliably invalidated when the enable signal line is broken. When the enable signal line is broken, a voltage, which is high enough for disabling the functional block, is applied to the functional block; and therefore, the functional block is invalidated.

According to another aspect of the present invention, a semiconductor apparatus further includes a program storage that stores software (program), which invalidates the functional block when at least one of the functional signal line and enable signal line is broken.

According to still another aspect of the present invention, a semiconductor apparatus further includes a circuit that makes a short-circuit between the ground voltage and power supply voltage when at least one of the functional signal line and enable signal line is broken. When one of the functional signal line and enable signal line is broken, a short-circuit is made, so that the semiconductor apparatus itself becomes invalidated and at the same time circuitry around the functional block gets in an error mode. As a result, the semiconductor apparatus is prevented from being analyzed in an unauthorized manner.

According to a further aspect of the present invention, a semiconductor apparatus includes a data storage that stores predetermined data; signal lines which are connected to the data storage; and a program storage that stores software, which invalidates the data, stored in the data storage, when at least one of the signal lines is broken.

According to another aspect of the present invention, a semiconductor apparatus includes a data storage that stores predetermined data; signal lines which are connected to the data storage; and a circuit that makes a short-circuit between the ground voltage and power supply voltage when at least one of the signal lines is broken.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

In the following embodiments, the same or corresponding elements are represented by the same reference numerals, and the same explanation will not be repeated to avoid redundant description.

(1) First Preferred Embodiment

Figure 1:
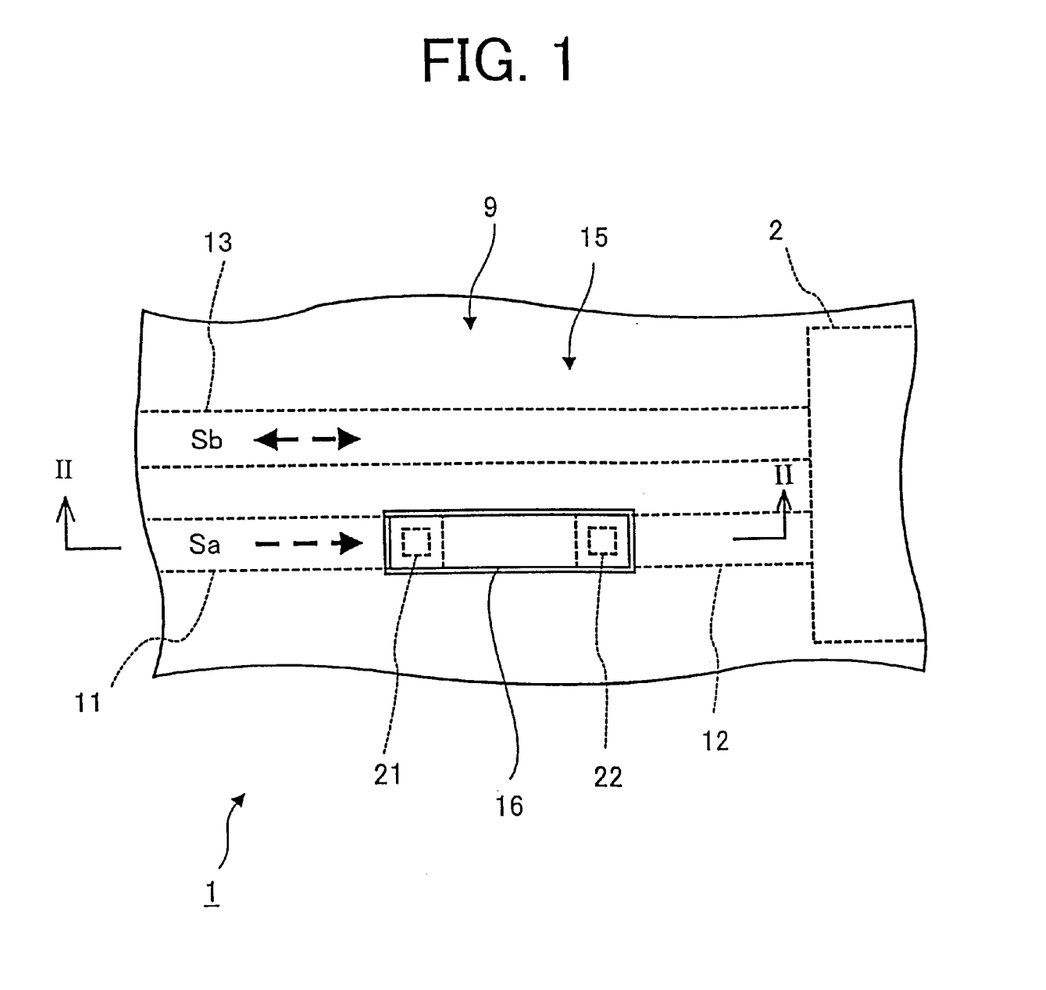
FIG. 1 is a plan view illustrating a semiconductor apparatus according to a first preferred embodiment of the present invention.
Figure 2:
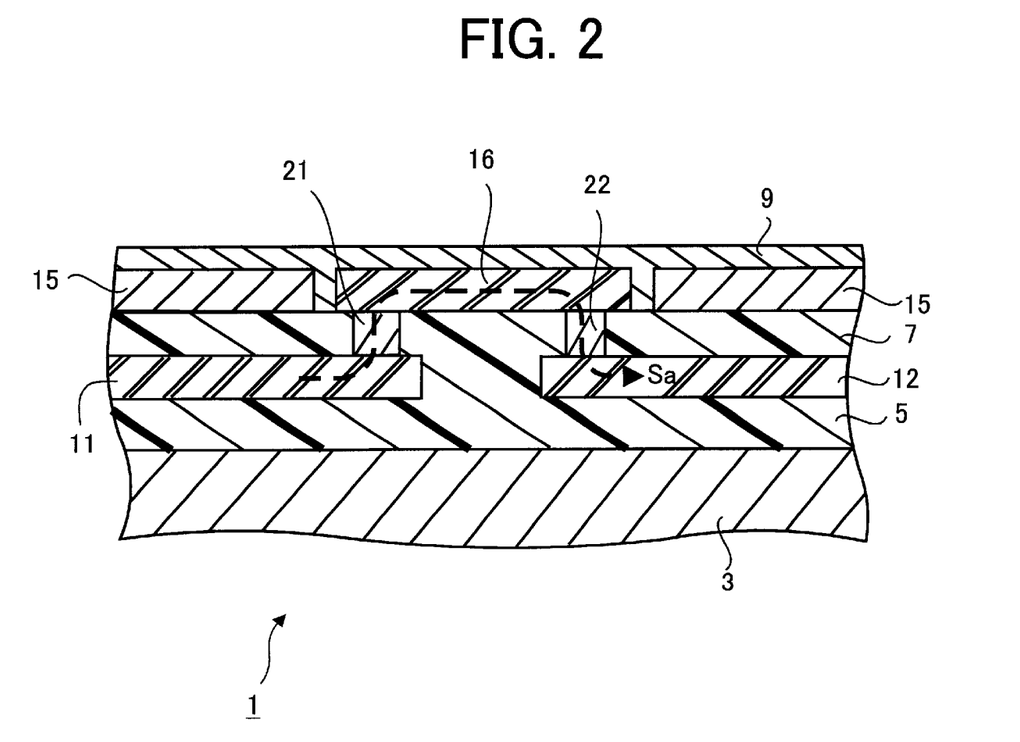
FIG. 2 is a cross-sectional view taken on line II—II in FIG. 1.

FIGS. 1 and 2 show a semiconductor apparatus according to a first preferred embodiment of the present invention, in which FIG. 1 is a plan view and FIG. 2 is a cross-sectional view, taken on line II—II in FIG. 1. The semiconductor apparatus 1 includes a functional block 2, that performs necessary functions for the proper operation; a semiconductor base layer 3; a first insulating layer 5; first and second enable-signal lines 11 and 12, which can be called "first and second metal lines in first layer"; a functional-signal line 13, which can be called "a third metal line in first layer"; a second insulating layer 7; an opaque protection layer 15, which is not transparent and can be called "first metal film in second layer"; a third enable-signal line 16, which can be called "third metal line in second layer"; and a protection layer 9.

The functional block 2 may be a memory, which stores restricted program for the semiconductor apparatus 1. The semiconductor base layer 3 includes well region, active region, gate region, and the like, which form a semiconductor device, such as a transistor. The semiconductor base layer 3 is insulated by the first insulating layer 5 from the first and second enable-signal lines 11 and 12 and functional-signal line 13. The first and second enable-signal lines 11 and 12 and functional-signal line 13 are insulated by the second insulating layer 7 from the opaque protection layer 15 and third enable-signal line 16.

The first enable-signal line 11 is electrically connected to the third enable-signal line 16 via a first through hole 21. The third enable-signal line 16 is electrically connected to the second enable-signal line 12 via a second through hole 22. The second enable-signal line 12 is connected to the functional block 2. The functional-signal line 13 is directly connected to the functional block 2.

A signal "Sa" is an enable signal, which is supplied to the functional block 2, to enable or disable the functional block 2. The operation or function of the functional block can not be recognized based on the enable signal Sa. As shown in FIGS. 1 and 2, the enable signal Sa travels to the functional block 2 via the pass of the first enable-signal line 11; first through hole 21; third enable-signal line 16; second through hole 22; and second enable-signal line 12 in order.

A signal "Sb" is an input functional signal/output functional signal. The functional signal Sb is supplied to the functional block 2 via the functional-signal line 13. The functional signal Sb is also supplied from the functional block 2 to the functional-signal line 13. The operation or function of the functional block 2 can be determined from the functional-signal Sb.

The opaque protection layer 15 may be made of metal. The opaque protection layer 15 is insulated from the first to third enable-signal lines 11, 12 and 16 and from the functional-signal line 13. The opaque protection layer 15 is formed so as to cover up at least the functional block 2, first and second enable-signal lines 11 and 12 and functional-signal line 13. The opaque protection layer 15 and third enable-signal line 16 are arranged to have a minimum distance to each other to assure the insulation between them. The functional-signal line 13 and third enable-signal line 16 are arranged to have a minimum distance to each other to assure the insulation between them. The protection layer 9 is formed to protect the semiconductor device 1.

According to the above described first preferred embodiment of the present invention, the functional block 2 in the semiconductor apparatus 1 is prevented from being analyzed as follows:

In order to analyze the functional block 2, the functional signal Sb must be detected. To detect the functional signal Sb with a probe needle, or the like, the functional-signal line 13 must be exposed. The functional-signal line 13 is covered entirely with the opaque protection layer 15 and the protection layer 9, so that the functional-signal line 13 can not be exposed until the opaque protection layer 15 and the protection layer 9 are removed.

The opaque protection layer 15 and third enable-signal line 16 are arranged to be close to each other, so that the third enable-signal line 16 is removed at the same time when the opaque protection layer 15 is removed with chemicals or the like. If the third enable-signal line 16 is removed, the functional block 2 becomes into a disable mode. That is because; the enable signal Sa can not reach the functional block 2, when the enable-signal line 16 is broken. As a result, the functional block 2 can not be analyzed in an unauthorized manner.

The third enable-signal line 16 and functional-signal line 13 are arranged to be close to each other, so that the functional-signal line 13 may be removed at the same time when the third enable-signal line 16 is removed in response to removal of the opaque protection layer 15. When the functional-signal line 13 is removed or broken, the functional signal Sb can not be detected. As a result, the functional block 2 can not be analyzed sufficiently in an unauthorized manner.

The semiconductor apparatus 1 is covered up with the opaque protection layer 15, so that it is difficult to determine the location of the functional-signal line 13.

Although, in FIGS. 1 and 2, only one enable-signal line (16) is formed in the second layer, a plurality of enable-signal lines is preferably formed on the entire area of the semiconductor apparatus 1. When a plurality of enable-signal lines is formed on the entire area of the semiconductor apparatus, the security of the semiconductor apparatus 1 is more improved.

(2) Second Preferred Embodiment

Figure 3:
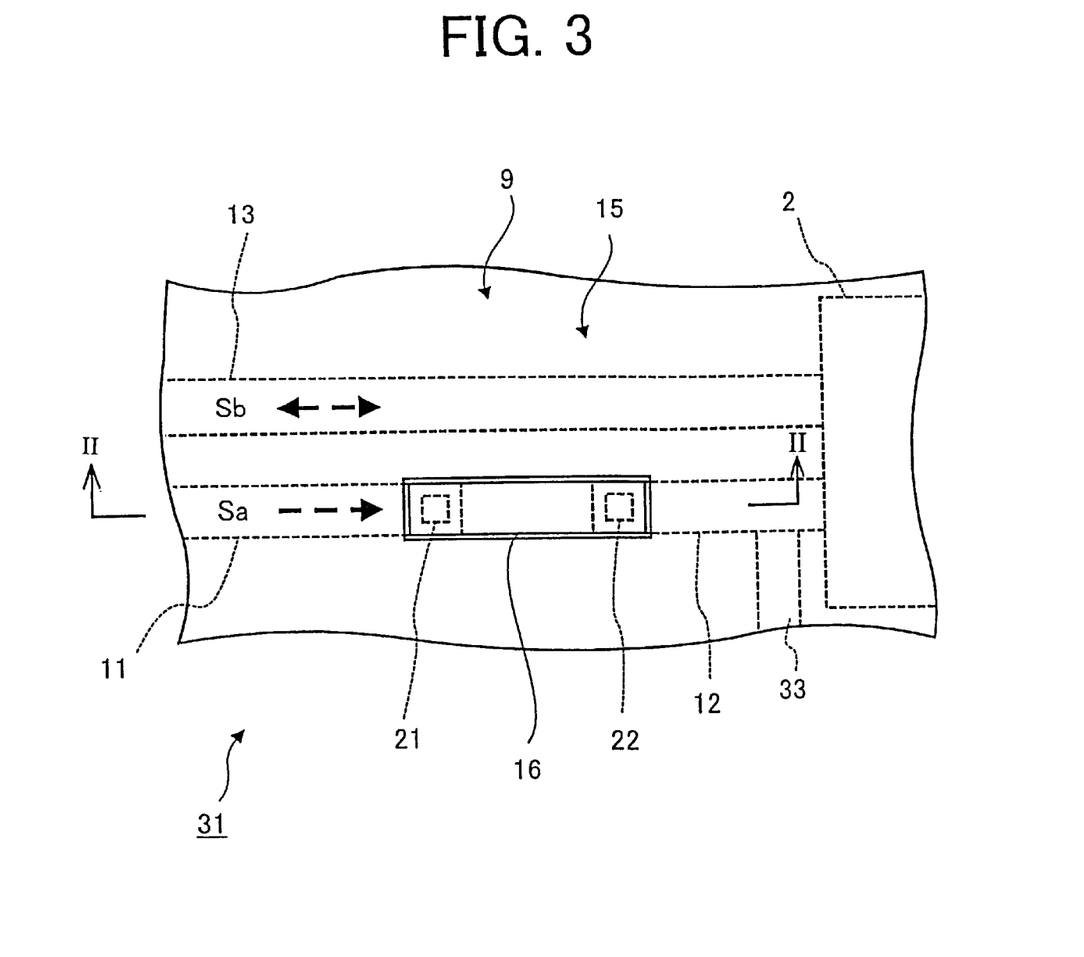
FIG. 3 is a plan view illustrating a semiconductor apparatus according to a second preferred embodiment of the present invention.

FIG. 3 shows a semiconductor apparatus according to a second preferred embodiment of the present invention. The semiconductor apparatus 31 further includes a resistance 33 in addition to the semiconductor apparatus 1, shown in FIGS. 1 and 2.

The resistance 33 is connected at one terminal to the second enable-signal line 12 and at the other terminal to the ground or power supply. That is, the resistance 33 functions as a so-called pull-up resistance or pull-down resistance, which is connected to an enable terminal of the functional block 2. When the enable terminal of the functional block 2 is active in high-level condition, for example, power supply voltage, the resistance 33 is connected to the ground to function as a pull-down resistance. When the enable terminal of the functional block 2 is active in low-level condition, for example, ground level, the resistance 33 is connected to the power supply to function as a pull-up resistance.

According to the above described semiconductor apparatus 31 of the second preferred embodiment, the following advantages can be obtained in addition to the advantages of the first preferred embodiment:

In the semiconductor apparatus 31 of the second preferred embodiment, when the opaque protection layer 15 is removed, the third enable-signal line 16 is removed at the same time. When the third enable-signal line 16 is removed or broken, the enable terminal of the functional block 2 does not get in a floating condition but is fixed to the ground level or power supply voltage level due to the function of the resistance 33. As a result, the functional block 2 is reliably disabled, so that the functional block 2 is prevented from being analyzed in an unauthorized manner.

(3) Third Preferred Embodiment

Figure 4:
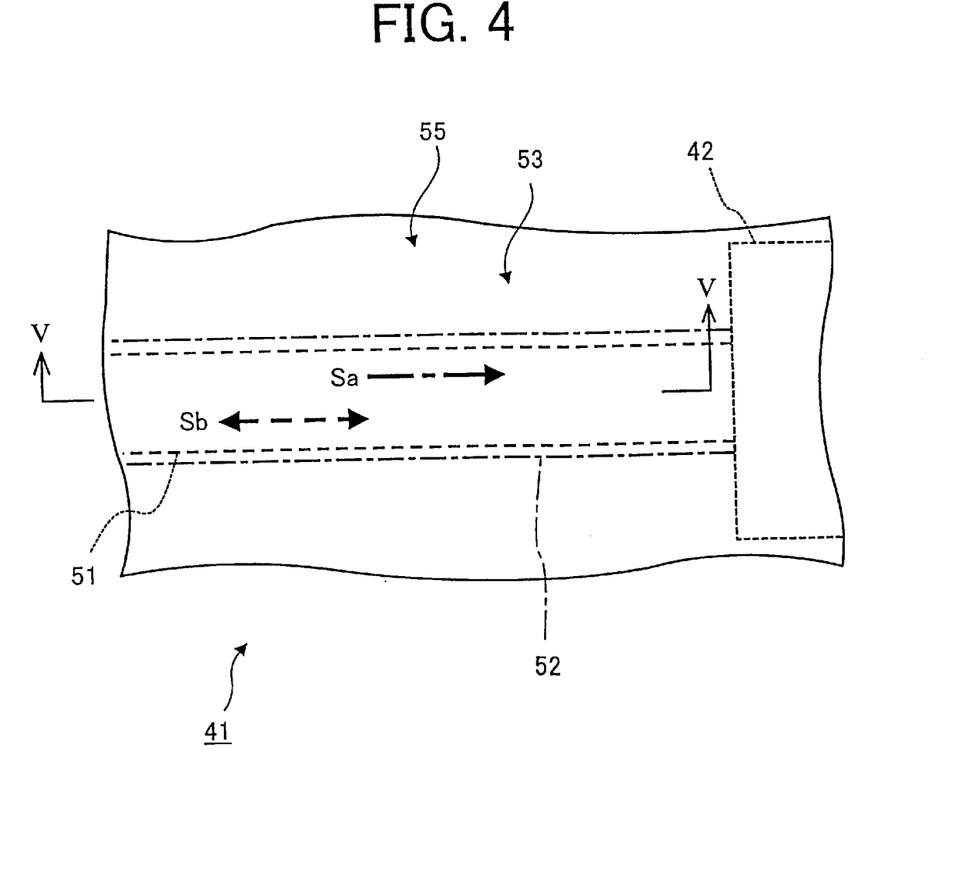
FIG. 4 is a plan view illustrating a semiconductor apparatus according to a third preferred embodiment of the present invention.
Figure 5:
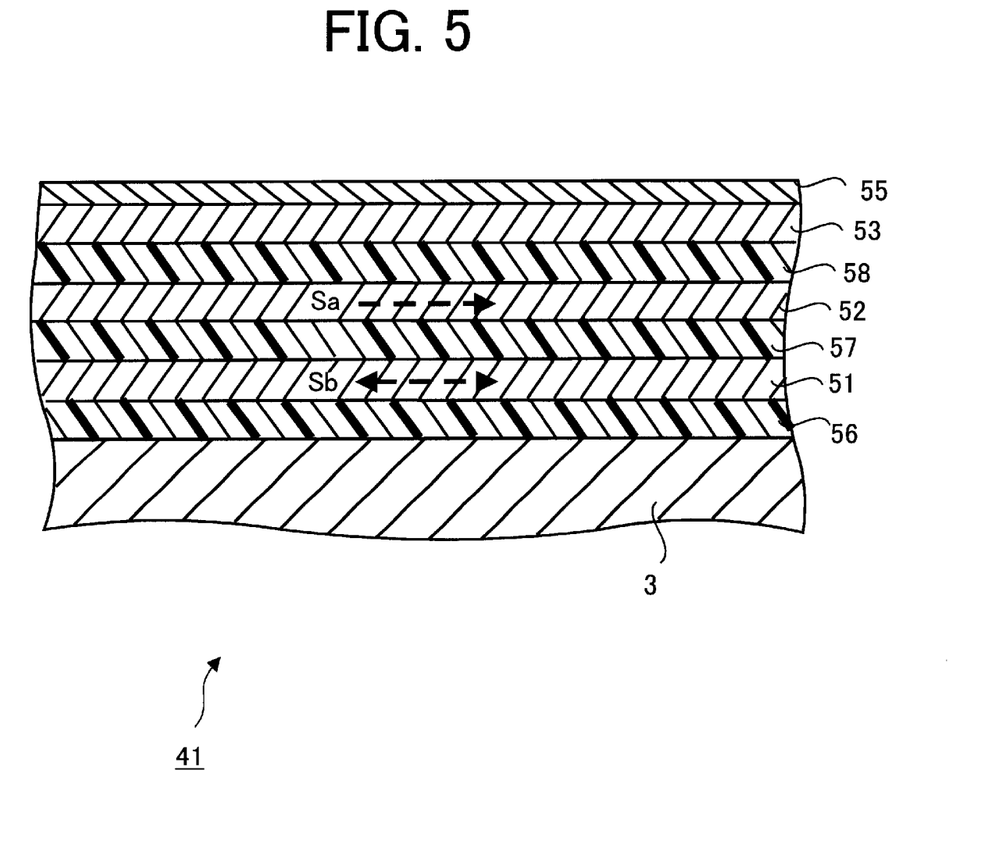
FIG. 5 is a cross-sectional view taken on line V—V in FIG. 4.

FIGS. 4 and 5 show a semiconductor apparatus according to a third preferred embodiment of the present invention, in which FIG. 4 is a plan view and FIG. 5 is a cross-sectional view, taken on line V—V in FIG. 4.

The semiconductor apparatus 41 includes a functional block 42, that performs a necessary functions for the proper operation; a semiconductor base layer 3; a first insulating layer 56; a functional-signal line 51, which can be called "metal line in first layer"; a second insulating layer 57; an enable-signal line 52, which can be called "metal line in second layer"; a third insulating layer 58; an opaque protection layer 53, which can be called "metal film in third layer"; and a protection layer 55.

The functional block 42 may be a memory, which stores operational program (restricted program) of the semiconductor apparatus 41. The functional-signal line 51 is insulated by the first insulating layer 56 from the semiconductor base layer 3, and is insulated by the second insulating layer 57 from the enable-signal line 52. The enable-signal line 52 is insulated by the third insulating layer 58 from the opaque protection layer 53.

The functional-signal line 51 and enable-signal line 52 are directly connected to the functional block 42. As shown in FIG. 4, the enable-signal line 52 is formed to cover the functional-signal line 51 entirely and completely.

A signal "Sa" is an enable signal, which is supplied to the functional block 42, to enable or disable the functional block 42. The operation or function of the functional block can not be recognized based on the enable signal Sa. The enable signal Sa travels to the functional block 42 via the enable-signal line 52.

A signal "Sb" is an input functional signal/output functional signal. The functional signal Sb is supplied to the functional block 42 via the functional-signal line 51. The functional signal Sb is supplied from the functional block 42 to the functional-signal line 51. The operation or function of the functional block 42 can be determined from the functional-signal Sb.

The opaque protection layer 53 may be made of metal. The opaque protection layer 53 is formed so as to cover at least the functional block 42, enable-signal line 52 and functional-signal line 51. The protection layer 55 is formed to protect the semiconductor device 1.

According to the above described third preferred embodiment of the present invention, the functional block 42 in the semiconductor apparatus 41 is prevented from being analyzed as follows:

In order to analyze the functional block 42, the functional signal Sb must be detected. To detect the functional signal Sb with a probe needle, or the like, the functional-signal line 51 must be exposed. The functional-signal line 51 is covered entirely with the protection layer 55, opaque protection layer 53 and enable-signal line 52, so that the functional-signal line 51 can not be exposed until those layers are all removed.

The enable-signal line 52 may be removed at the same time when the opaque protection layer 53 is removed with chemicals or the like. If the enable-signal line 52 is removed, the functional block 42 becomes into a disable mode. That is because; the enable signal Sa can not reach the functional block 42. As a result, the functional block 42 can not be analyzed in an unauthorized manner.

Even if the opaque protection layer 53 is removed without braking the enable-signal line 52, the enable-signal line 52 must be removed anyway in order to expose the functional-signal line 51. Therefore, the functional block 42 is disabled and is prevented from being analyzed. Even if the enable-signal line 52 is removed without braking, it is difficult to take enough area to insert a probe needle into the functional-signal line 51. The probe needle may easily touch the enable-signal line 52, and therefore, a short circuit is easily made between the functional-signal line 51 and enable-signal line 52.

When the enable-signal line 52 is removed, the functional-signal line 53 is removed at the same time. As a result, the functional signal Sb can not be detected, and therefore, the functional block 42 can not be analyzed sufficiently in an unauthorized manner.

The semiconductor apparatus 41 is covered with the opaque protection layer 53, so that it is difficult to find the location of the enable-signal line 52 for the purpose of exposing the functional-signal line 51.

(4) Fourth Preferred Embodiment

Figure 6:
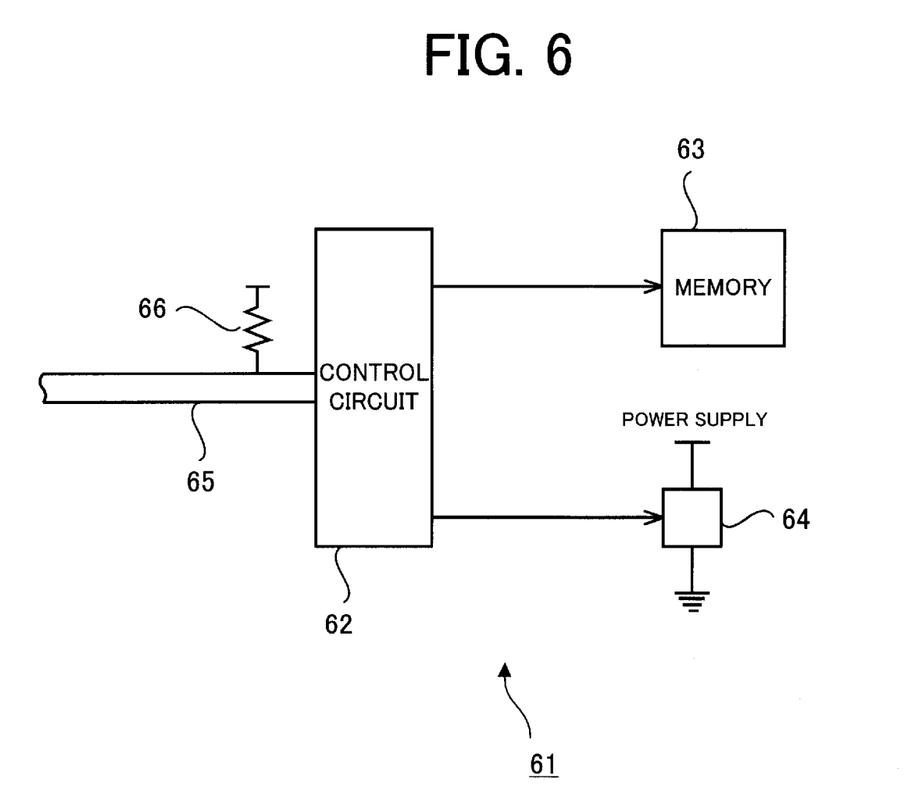
FIG. 6 is a block diagram illustrating a semiconductor apparatus according to a fourth preferred embodiment of the present invention.

FIG. 6 shows a semiconductor apparatus according to a fourth preferred embodiment of the present invention. The semiconductor apparatus 61 includes a control circuit 62; a memory 63, which stores a predetermined program; a switch 64, which makes a short circuit; a metal line 65; and a resistance 66.

The metal line 65 is removed when a detecting point is exposed for analyzing the semiconductor apparatus 61. The metal line 65 corresponds to the enable-signal line 52 or functional-signal line 53 in the semiconductor apparatus 41 according to the third preferred embodiment. A signal of ground level or power supply voltage is supplied from a circuit, not shown, through the metal line 65 to the control circuit 62.

The resistance 66 is connected at one terminal to the metal line 65 and at the other terminal to the ground or power supply.

The memory 63 is a non-volatile memory, such as EEPROM and FeRAM, which stores an erasing program that erases all the data or program stored therein or stored in other memories. The switch 64 is connected between the ground and power supply, and is opened in the normal state.

The control circuit 62 controls the memory 63 and switch 64 as follows: The control circuit 62, for example, drives the erasing program, stored in the memory 63, when the input terminal changed in level high to low (ground level). When the erasing program starts, all the data stored in the memory 63 itself and other memories are erased. As a result, the semiconductor apparatus 61 is invalidated and not operable. At the same time, the control circuit 62 controls the switch 64 to make a short circuit between the ground and power supply. Once a short circuit is generated, the semiconductor apparatus 61 can no longer operate. The control circuit 62 can be designed to start the erasing program and operates the switch 64 when the input terminal changed in level low (ground level) to high.

Next, the operation of the semiconductor apparatus 61 according to the fourth preferred embodiment will be described. It is assumed that a ground-level signal is supplied from a circuit, not shown, through the metal line 65 to the control circuit 62; and the resistance 66 is connected between the metal line 65 and power supply.

As described above, the semiconductor apparatus 61 according to the fourth preferred embodiment is well designed so that the metal line 65 is removed at the same time when a detecting point is exposed in an unauthorized manner. When the metal line 65 is removed, a ground-level signal is not supplied to the control circuit 62. In other words, the control circuit 62 is applied at the input terminal with a power-supply voltage due to the function of the resistance 66. In response to such a change of voltage, the control circuit 62 starts the erasing program, stored in the memory 63, so that all the data stored in the memory 63 and other memory devices are deleted. At the same time, the control circuit 62 make a short circuit between the ground and power supply.

As described above, according to the semiconductor apparatus 61 of the fourth preferred embodiment, when the inside of the semiconductor apparatus 61 is exposed for analyzing it, all the operational data are deleted and a short circuit is generated. When all the operational data are deleted and a short circuit is generated, the semiconductor apparatus 61 becomes invalidated, and therefore, the function of the semiconductor apparatus 61 can not be analyzed or detected.

In the above described semiconductor apparatuses 1 and 31 according to the first and second preferred embodiments, the opaque protection layer 15 mainly functions to cover up the enable-signal lines 11 and 12. The opaque protection layer 15 can be made of a material other than metal as long as it is opaque. In the same manner, the opaque protection layer 53, included in the semiconductor apparatus 41 according to the third preferred embodiment, can be made of a material other than metal as long as it is opaque.

The above described semiconductor apparatuses 1 and 31, according to the first and second preferred embodiments, is designed so that the enable signal Sa travels along the first to third enable-signal lines 11, 12 and 16. The semiconductor apparatuses 1 and 31, however can be designed so that the enable signal Sa travels only along the third enable-signal line 16.

In the above described semiconductor apparatuses 1, 31 and 41 according to the first to third preferred embodiments, only one insulating layer is arranged between the signal line for the enable signal Sa and the signal line for the functional signal Sb. The present invention is not limited by such a structure, however, the signal line for the enable signal Sa is formed close to the surface, which should be plural layers above the signal line for the functional signal Sb.

In the above described semiconductor apparatuses 1 and 31 according to the first and second preferred embodiments, the opaque protection layer 15 is formed in the second layer, which is the same layer as the third enable-signal 16. The present invention is not limited by such a structure, however, the opaque protection layer 15 can be formed close to the surface, which is upper than the enable-signal line 16.

The semiconductor apparatus 61, according to the fourth preferred embodiment, is designed so that the all the data stored in the memory 63 and the other memory devices are erased by the erasing program (software) stored in the memory 63 itself. The present invention is not limited by such a structure, however, the correct data can be replaced by dummy or error data when the semiconductor apparatus is analyzed in an unauthorized manner so as to make errors intentionally.

The semiconductor apparatus 61, according to the fourth preferred embodiment, includes both the functions of erasing the data, stored in the memory 63, using erasing program stored therein, and of making a short circuit between the ground and power supply using the switch 64. The present invention is not limited by such a structure, however, one of those function can prevent unauthorized analyzing of the semiconductor apparatus.

The elements used in the semiconductor apparatus 61, according to the fourth preferred embodiment, the control circuit 62, memory 63, switch 64, metal line 65 and resistance 66 can be added to each of the semiconductor apparatuses 1, 31 and 41, according to the first to third preferred embodiments. Those additional elements improve the security of the semiconductor apparatus.

What is claimed is:

1. A semiconductor apparatus, which is comprising:

a data storage that stores predetermined data;

signal lines which are connected to the data storage; and a program storage that stores software, which invalidates the data, stored in the data storage, when at least one of the signal lines is broken.

2. A semiconductor apparatus, which is comprising:

a data storage that stores predetermined data;

signal lines which are connected to the data storage; and a circuit that makes a short-circuit between the ground voltage and power supply voltage when at least one of the signal lines is broken.

3. A semiconductor apparatus, which is comprising:

a data storage that stores predetermined data;

signal lines which are connected to the data storage;

a program storage that stores software which invalidates the data, stored in the data storage, when at least one of the signal lines is broken; and a circuit that makes a short-circuit between the ground voltage and power supply voltage when at least one of the signal lines is broken.

4. A semiconductor apparatus, comprising:

a base layer;

a first insulating layer which is formed on said base layer;

a first conducting layer which is formed on said base layer, a first signal being transmitted along said first conducting layer;

a second conducting layer which is formed on said base layer, the first signal being transmitted along said second conducting layer;

a second insulating layer which is formed on said first and second conducting layers and said first insulating layer, wherein said second insulating layer has a first through hole formed through to said first conducting layer and a second through hole formed through to said second conducting layer;

a third conducting layer which is formed on said second insulating layer and in said first and second through holes, the first signal being transmitted along said third conducting layer;

a first protection layer which is formed on said second insulating layer; and a second protection layer which is formed on said second insulating layer and said third conducting layer.

5. The semiconductor apparatus at claim 4, wherein said first protection layer is an opaque layer.

6. The semiconductor apparatus of claim 4, wherein the first signal is an enable signal that is provided along said first, second and third conducting layers to a functional block that performs functional operations.

7. The semiconductor apparatus of claim 5, wherein said second protection layer is an opaque layer.

8. The semiconductor apparatus of claim 7, wherein said second protection layer is also formed on said first protection layer.

9. The semiconductor apparatus of claim 7, wherein the opaque layers are a metal.

10. The semiconductor apparatus of claim 6, wherein said first protection layer also covers said functional block.

11. The semiconductor apparatus of claim 6, wherein said third conducting layer is directly coupled to said functional block, the semiconductor apparatus further comprising:

a resistance coupled between said third conducting layer and a power source of the semiconductor apparatus.

12. The semiconductor apparatus of claim 6, further comprising a program storage that stores software which invalidates operation of said functional block when a least one of said first, second and third conducting layers is broken.

13. The semiconductor apparatus of claim 6, further comprising a switch coupled between a ground and a power supply of the semiconductor apparatus, said functional block closing said switch when at least one of said first, second and third conducting layers is broken.

14. A semiconductor apparatus, comprising:

a base layer;

a first insulating layer which is formed on said base layer;

a first conducting layer which is formed on said base layer, a first signal being transmitted along said first conducting layer;

a second conducting layer which is formed on said base layer, the first signal being transmitted along said second conducting layer;

a second insulating layer which is formed on said first and second conducting layers and said first insulating layer;

a third conducting layer which is formed on said second insulating layer and which is electrically connected to said first and second conducting layers, the first signal being transmitted along said third conducting layer;

a first protection layer which is formed on said second insulating layer; and a second protection layer which is formed on said second insulating layer and said third conducting layer.

15. A semiconductor apparatus comprising:

a base layer;

a first insulating layer which is formed on said base layer;

a first conducting layer which is formed on an area of said first insulating layer and which is coupled to a functional block that performs functional operations, a functional signal being provided along said first conducting layer to the functional block;

a second insulating layer which is formed on said first conducting layer and said first insulating layer;

a second conducting layer which is formed on said second insulating layer and which is coupled to the functional block, an enable signal being provided along said second conducting layer to the functional block, an area of said second conducting layer covering all of said first conducting layer; and a protection layer formed on an upper surface of the semiconductor apparatus including at least said second conducting layer.

16. The semiconductor apparatus of claim 15, further comprising a third insulating layer formed between said protection layer and said second conducting layer.

17. The semiconductor apparatus of claim 15, wherein said protection layer is an opaque layer.

18. The semiconductor apparatus of claim 15, wherein said protection layer is also formed on the functional block.

19. The semiconductor apparatus of claim 15, wherein operation of the functional block is invalidated when said second conducting layer is broken.

20. The semiconductor apparatus of claim 16, wherein said protection layer is a metal layer.

* * * * *